(12) United States Patent
Feki

(10) Patent No.: US 9,007,848 B2
(45) Date of Patent: Apr. 14, 2015

(54) VOLATILE MEMORY WITH A DECREASED CONSUMPTION AND AN IMPROVED STORAGE CAPACITY

(71) Applicant: STMicroelectronics S.A., Montrouge (FR)

(72) Inventor: Anis Feki, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 141 days.

(21) Appl. No.: 13/754,427

(22) Filed: Jan. 30, 2013

(65) Prior Publication Data

US 2013/0201766 A1   Aug. 8, 2013

(30) Foreign Application Priority Data

Feb. 3, 2012  (FR) ...................................... 12 51037

(51) Int. Cl.

| G11C 7/10 | (2006.01) |
|---|---|
| G11C 7/00 | (2006.01) |
| G11C 7/18 | (2006.01) |
| G11C 8/12 | (2006.01) |
| G11C 8/14 | (2006.01) |
| G11C 8/16 | (2006.01) |

(52) U.S. Cl.
CPC .. *G11C 7/10* (2013.01); *G11C 7/00* (2013.01); *G11C 7/18* (2013.01); *G11C 8/12* (2013.01); *G11C 8/14* (2013.01); *G11C 8/16* (2013.01)

(58) Field of Classification Search
USPC ........................................ 365/189.02, 189.04
See application file for complete search history.

(56) References Cited

U.S. PATENT DOCUMENTS

| 5,457,647 | A | 10/1995 | McClure |
|---|---|---|---|
| 5,790,461 | A * | 8/1998 | Holst ........................ 365/189.04 |
| 6,084,819 | A | 7/2000 | Kablanian |
| 6,594,194 | B2 * | 7/2003 | Gold et al. ............... 365/230.03 |
| 6,798,704 | B2 * | 9/2004 | Chen et al. ..................... 365/205 |
| 7,304,904 | B2 * | 12/2007 | Lambrache et al. .......... 365/205 |
| 7,710,814 | B2 * | 5/2010 | Lambrache et al. ...... 365/230.05 |
| 7,830,727 | B2 * | 11/2010 | Arsovski et al. ......... 365/189.15 |
| 8,598,907 | B2 * | 12/2013 | Chandler et al. ................ 326/38 |
| 2004/0008564 | A1 | 1/2004 | Tsuda et al. |
| 2008/0165562 | A1 | 7/2008 | Matick et al. |
| 2010/0124099 | A1 | 5/2010 | Wu et al. |
| 2014/0136778 | A1 * | 5/2014 | Khailany et al. ............... 711/114 |

OTHER PUBLICATIONS

Wu, Jui-Jen, et al., "A Large σ $V_{th}$/VDD Tolerant Zigzag 8T SRAM With Area-Efficient Decoupled Differential Sensing and Fast Write-Back Scheme," IEEE Journal of Solid-State Circuits, vol. 46, No. 4, Apr. 2011, 14 pages.

(Continued)

*Primary Examiner* — Son Mai
(74) *Attorney, Agent, or Firm* — Slater & Matsil, L.L.P.

(57) ABSTRACT

A volatile memory includes volatile memory cells in which data write and read operations are performed. The memory cells are arranged in rows and in columns and are distributed in first separate groups of memory cells for each column. The memory includes, for each column, a write bit line dedicated to write operations and connected to all the memory cells of the column and read bit lines dedicated to read operations. Each read bit line is connected to all the memory cells of one of the first groups of memory cells. Each memory cell in the column is connected to a single one of the read bit lines.

20 Claims, 7 Drawing Sheets

(56) References Cited

OTHER PUBLICATIONS

Azam, T., et al., "Variability Resilient Low-power 7T-SRAM Design for nano-Scaled Technologies," IEEE 11th International Symposium on Quality Electronic Design (ISQED), Mar. 22-24, 2010, pp. 9-14.

Shibata, N., et al., "A 0.5-V 25-MHz 1-mW 256-Kb MTCMOS/SOI SRAM for Solar-Power-Operated Portable Personal Digital Equipment-Sure Write Operation by Using Step-Down Negatively Overdriven Bitline Scheme," IEEE Journal of Solid-State Circuits, vol. 41, No. 3, Mar. 2006, pp. 728-742.

* cited by examiner

VOLATILE MEMORY WITH A DECREASED CONSUMPTION AND AN IMPROVED STORAGE CAPACITY

The present invention claims priority to French patent application 1251037, filed Feb. 3, 2012 and incorporated herein by reference.

TECHNICAL FIELD

The present disclosure relates to integrated circuits comprising volatile memory elements.

BACKGROUND

An integrated circuit memory may be formed of an assembly of memory elements, or memory cells, which may be arranged in an array. The writing and reading of data in memory cells are performed by dedicated logic circuits. A power supply generally provides the power necessary to the proper operation of the memory cell components and of the logic circuit. The memory power supply is generally obtained over one or several rails connected to all the memory cells and transmitting a power supply voltage. A memory is called volatile in the case where the data stored in the memory cells risk being lost when the memory power supply voltage falls below a minimum threshold.

FIG. 1 shows an example of a volatile memory cell 1 of a volatile memory of static random access memory type (SRAM). Memory cell 1 comprises six metal-oxide gate field-effect transistors, also called MOS transistors. Memory cell 1 belongs to a memory plane where the memory cells are distributed in rows and in columns.

Memory cell 1 comprises two inverters $INV_L$, $INV_R$ connected in antiparallel. Inverters $INV_L$, $INV_R$ are connected between a source of a high voltage VDD and a source of a low voltage, generally ground GND. In the following description, the ground voltage is selected to be equal to 0V. Inverter $INV_L$ comprises a P-type MOS transistor $PU_L$ having its source connected to voltage source VDD and having its drain connected to a node $I_L$ corresponding to the input of inverter $INV_R$. Inverter $INV_L$ comprises an N-type MOS transistor $PD_L$ having its source connected to ground GND and having its drain connected to node $I_L$. Inverter $INV_R$ comprises a P-type MOS transistor $PU_R$ having its source connected to the source of voltage VDD and having its drain connected to a node $I_R$ corresponding to the input of inverter $INV_L$. Inverter $INV_R$ comprises an N-type MOS transistor $PD_R$ having its source connected to ground GND and having its drain connected to node $I_R$. The gates of transistors $PU_L$ and $PD_L$ are connected to node $I_R$ and the gates of transistors $PU_R$ and $PD_R$ are connected to node $I_L$.

Nodes $I_L$ and $I_R$ are connected to bit lines BLT and BLF via switches $PG_L$ and $PG_R$ controlled by a row selection signal transmitted over a word line WL. Switch $PG_L$ may be an N-type MOS transistor having its gate connected to word line WL and having its other conduction terminals respectively connected to bit line BLT and to node $I_L$. Similarly, switch $PG_R$ may be an N-type MOS transistor having its gate connected to word line WL and having its other conduction terminals respectively connected to node $I_R$ and to bit line BLF. Word line WL extends over the memory row comprising memory cell 1 and is connected to each memory cell in the row. Bit lines BLT and BLF extend on the memory column to which memory cell 1 belongs and are connected to each memory cell in the column.

In the following description, a bit line, a word line, or a node is said to be in the low state when the voltage on this line or on this node is at a low level, for example, at ground voltage GND, and a bit line, a word line, or a node is said to be in the high state when the voltage on this line or on this node is at a high level, for example, approximately equal to power supply voltage VDD. However, the high and low levels may be different for each word line, each bit line, and each node.

Memory cell 1 enables to store a binary datum or bit "0" or "1". As an example, the storage of datum "1" corresponds to the case where the voltage at node $I_L$ is in the high state and the voltage at node $I_R$ is in the low state and the storage of datum "0" corresponds to the case where the voltage at node $I_L$ is in the low state and the voltage at node $I_R$ is in the high state.

There is a current tendency to increase the density of memories. This causes a local increase of the number of memory cells per column. However, some constraints may limit the maximum possible number of memory cells per column. One constraint is the capacitance of each bit line, which increases along with the number of memory cells coupled to the bit line. The larger the bit line capacitance, the more the bit line charge/discharge operation takes time during the read/write operation, which causes a decrease in the memory operating frequency.

U.S. Pat. No. 5,457,647 describes a RAM comprising a hierarchic configuration of bit lines wherein, for each column, bit lines BLT and BLF are divided into pairs of bit line portions. Each pair of bit line portions is connected to a group of memory cells. Two additional general bit lines are connected to all the pairs of bit line portions by switches. Selection lines extending along certain memory rows enable to select the switches. In a read or write operation, one of the pairs of bit line portions is selected by turning on the associated switches.

A hierarchic bit line configuration is complex since it entails the addition of general bit lines for each column, of switches distributed on each column, and of switch selection lines on certain memory rows.

For some applications, the consumption of the integrated circuit comprising a volatile memory is a critical factor. This may concern medical applications or wireless applications, which require a low consumption. As an example, the integrated circuit may be provided on medical implants, portable electronic elements, or a sensor network. It is, for example, an integrated circuit equipping a cell phone, the integrated circuit being powered by the phone battery.

A decrease of the memory consumption may be obtained by decreasing the memory power supply voltage. However, decreasing the power supply voltage results in decreasing the read current and accordingly decreasing the number of memory cells per column to avoid read errors in an operation of reading of the datum stored in memory cell 1.

Indeed, in an operation of reading of the datum stored in a memory cell, word line WL associated with the selected memory cell is set to the high state and the word lines of all the other memory rows are set to the low state. Switches $PG_L$ and $PG_R$ of the selected memory cell 1 are thus off. Bit lines BLT and BLF are left floating. According to the datum stored in the memory cell, the voltage of one of bit lines BLT, BLF rises and the voltage of the other bit line BLT, BLF decreases. However, even if switches $PG_L$ and $PG_R$ of all the other memory cells of the column are on, leakage currents may flow for these memory cells through some of switches $PG_L$ and $PG_R$. With the decrease of power supply voltage VDD, the ratio of the read current (Tread) to the total leakage current corresponding to the sum of the leakage currents of the unselected memory cells (Ileakage) of the column decreases.

Incorrect variations of the voltages of bit lines BLT and BLF, and thus read errors, may thus occur. It may then be necessary to decrease the number of memory cells per column.

The provision of additional bit lines dedicated to read operations to decrease leakage currents in read operations in a volatile memory of decreased consumption is known.

FIG. 2 shows an embodiment of a memory cell 2 such as that described in publication "A Large $\sigma V_{TH}$/VDD Tolerant Zigzag 8T SRAM With Area-Efficient Decoupled Differential Sensing and Fast Write-Back Scheme" by Jui-Jen Wu, Yen-Huei Chen, Meng-Fan Chang, Po-Wei Chou, Chien-Yuan Chen, Hung-Jen Liao, Ming-Bin Chen, Yuan-Hua Chu, Wen-Chin Wu, and Hiroyuki Yamauchi (IEEE Journal of Solid-State Circuits, Vol. 46, N°4, April 2011).

As compared with cell 1 shown in FIG. 1, memory cell 2 further comprises two read bit lines RBLT and RBLF, one read word line RWL, and two N-type MOS transistors, $RPD_L$ and $RPD_R$, dedicated to read operations. The gate of transistor $RPD_L$ is connected to node $I_L$. One of the conduction terminals of transistor $RPD_L$ is connected to read bit line RBLT and the other conduction terminal of transistor $RPD_L$ is connected to read word line RWL. The gate of transistor $RPD_R$ is connected to node $I_R$. One of the conduction terminals of transistor $RPD_R$ is connected to read bit line RBLT and the other conduction terminal of transistor $RPD_R$ is connected to read word line RWL. Word line WL and bit lines BLT and BLF are dedicated to write operations.

In a read operation or a retention operation, read bit lines RBLT and RBLF are set to VDD.

In a read operation, read bit lines RBLT and RBLF are left floating and read word line RWL of the selected memory cell 2 is set to the low state while the word lines RWL associated with the other memory rows are maintained in the high state. Read bit lines RBLT and RBLF are initially floating in the high state. When datum "1" is stored in memory cell 2, only transistor $RPD_L$ is conductive. The voltage of bit line RBLT decreases. Transistor $RPD_R$ is off and bit line RBLF remains in the high state. Voltage difference Vdiff between bit lines RBLT and RBLF can then be detected. The time for which read word line RWL is set to the low state is sufficiently short for voltage Vdiff to remain smaller than the threshold voltage of transistors $RPD_L$ and $RPD_R$. For the other memory cells of the column, the gate-source voltage of transistors $RPD_L$ and $RPD_R$ is at most equal to Vdiff. These transistors thus remain off. Further, the drain-source voltage of transistors $RPD_L$ and $RPD_R$ of the unselected memory cells of the column is at most equal to Vdiff so that leakage currents remain low as compared with those obtained for memory cell 1. Read errors are thus decreased even if the number of memory cells per column is high.

However, memory cell 2 shown in FIG. 2 has several disadvantages.

Indeed, for applications for which the memory cell power supply voltage is low, the on-state current of transistors $RPD_L$ or $RPD_R$ is decreased. The number of memory cells per column must then be decreased to decrease the impact of the read bit line capacitance during the read operation.

Further, even though transistors $RPD_L$ and $RPD_R$ may be designed to have decreased leakage currents in an operation of reading of the datum read from a memory cell of a column, the leakage currents of the unaddressed memory cells of the same column may disturb the read datum if the ratio of the read current (Tread) to the sum of the leakage currents (Ileakage) is too small, for example, smaller than 10.

Moreover, for applications where the memory must operate at a high rate, it may be necessary to decrease the number of cells per column to decrease the total duration of a read operation.

A memory cell overcoming all or part of the previously-described disadvantages is thus needed.

SUMMARY OF THE INVENTION

An embodiment provides a volatile memory of low power supply voltage, which comprises a high number of memory cells per column.

Another embodiment provides that the low supply voltage memory cell, when integrated, takes up a surface area similar to the surface area taken up by a known low supply voltage memory cell.

Thus, an embodiment provides a memory cell comprising volatile memory cells where data write and read operations are carried out, the memory cells being arranged in rows and in columns and, further, being distributed in first separate groups of memory cells for each column. The memory comprises, for each column, a write bit line dedicated to write operations and connected to all the memory cells in the column and read bit lines dedicated to read operations, each read bit line being connected to all the memory cells of one of the first groups of memory cells, each memory cell in the column being connected to a single one of the read bit lines.

According to an embodiment, the memory comprises, for each column, a multiplexer connected to all the read bit lines and receiving a control signal, the multiplexer being capable of delivering the signal present on one of the read bit lines to an amplifier according to the control signal.

According to an embodiment, the memory cells are distributed in second separate groups of memory cells for each row. The memory comprises a first memory cell selection circuit dedicated to write operations and a second memory cell selection circuit, different from the first circuit, dedicated to read operations. The first circuit is capable of selecting, for each row, memory cells from one of the first groups of memory cells for a write operation, the second circuit being capable of selecting, for each row, memory cells from one of the first groups of memory cells for a read operation.

According to an embodiment, the second selection circuit comprises read word lines for each row, each read word line being connected to all the memory cells of one of the second groups of memory cells, for each row, each memory cell in the row being connected to a single one of the read word lines.

According to an embodiment, each memory cell comprises first and second inverters, the output of the first inverter being connected to the input of the second inverter and the output of the second inverter being connected to the input of the first inverter, a first switch connected to the output of the first inverter, a second switch connected to the output of the second inverter, a first MOS transistor having two first conduction terminals and a first gate, the first gate being connected to the output of the first inverter, a second MOS transistor having two second conduction terminals and a second gate, the second gate being connected to the output of the second inverter.

Each read word line is connected to one of the first conduction terminals and to one of the second conduction terminals, and the first selection circuit comprises a circuit capable of turning on the first and second switches of one of the groups of memory cells.

According to an embodiment, the memory comprises, for each column and for each first group of the column, first and second read bit lines, and the other one of the first conduction terminals of the first MOS transistor is connected to the first read bit line and the other one of the second conduction terminals of the second MOS transistor is connected to the second read bit line.

According to an embodiment, the first switch comprises a third MOS transistor connecting the output of the first inverter to a first write bit line. The second switch comprises a fourth MOS transistor connecting the output of the second inverter to a second write bit line.

According to an embodiment, the first selection circuit comprises write word lines for each row, each write word line being connected to the gates of the third and fourth MOS transistors of the memory cells of one of the groups of memory cells.

According to an embodiment, the first selection circuit comprises a third inverter, the output of the third inverter being connected to the gates of the third and fourth transistors and the input of the third inverter being connected to a write word line.

According to an embodiment, the first selection circuit comprises a fifth MOS transistor interposed between the third MOS transistor and the first write bit line and a sixth MOS transistor interposed between the fourth MOS transistor and the second write bit line.

An embodiment provides an electronic device comprising a battery and a memory such as previously described, powered by the battery.

The foregoing and other features and advantages will be discussed in detail in the following non-limiting description of specific embodiments in connection with the accompanying drawings.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
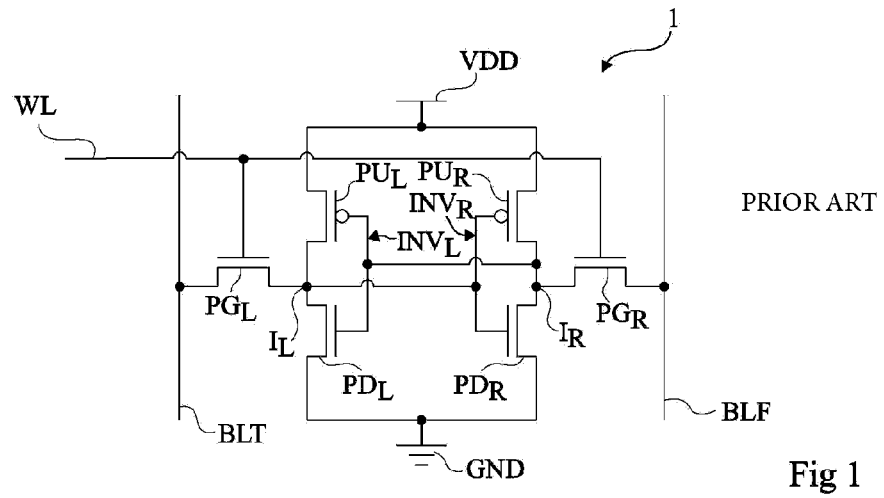
FIGS. 1 and 2 schematically show known examples of a volatile memory cell.

For clarity, the same elements have been designated with the same reference numerals in the different drawings. In the following description, expression "conduction terminal" of a MOS transistor indifferently designates the MOS transistor source or drain.

The embodiments described hereafter may be implemented with a memory cell comprising read bit lines dedicated to read operations and separate from the write bit lines. In this type of cells, the read and write paths are separate.

Figure 2:
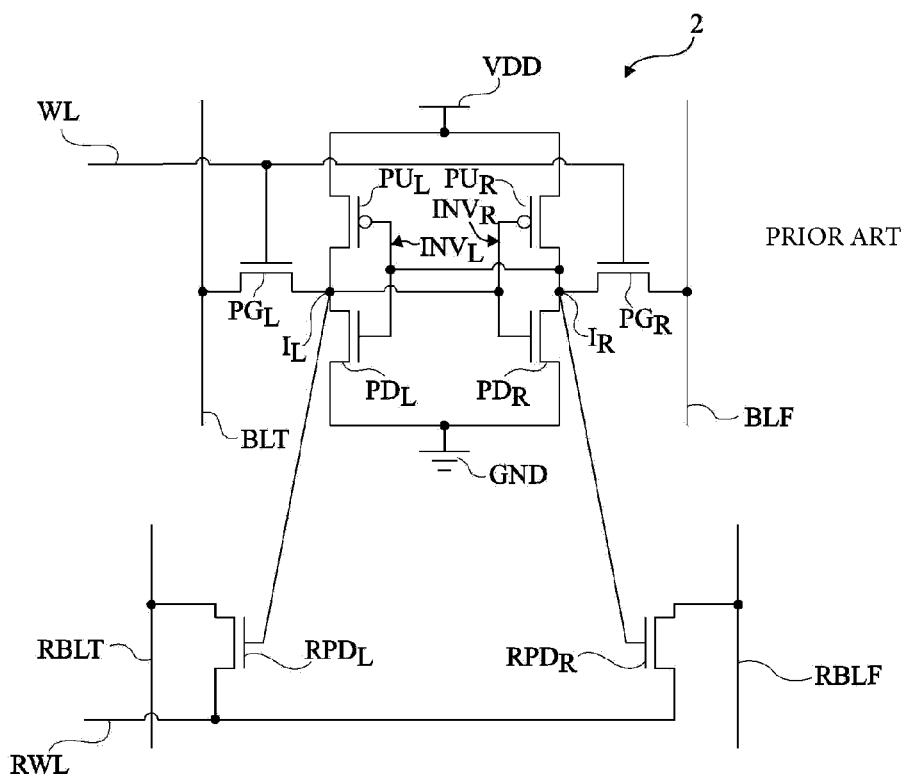

As an example, the present embodiment may be implemented with the memory cell example described in FIG. 2. However, the embodiment of the present invention may be implemented in other examples of memory cells, and especially the memory cells described in publication "A 0.5-V 25-MHz 1-mW 256-Kb MTCMOS/SOI SRAM for Solar-Power-Operated Portable Personal Digital Equipment-Sure Write Operation by Using Step-Down Negatively Overdriven Bitline Scheme" by Nobutaro Shibata, Hiroshi Kiya, et al. (IEEE Journal of Solid-State Circuits, Vol. 41, N°3, March 2006) or in publication "Variability Resilient Low-power 7T-SRAM Design for Nano-Scaled Technologies" by Touqeer Azam, Binjie Cheng, and David R. S. Cumming (11*th International Symposium on Quality Electronic Design (ISQED)*, 22-24 Mar. 2010, 2010, pp. 9-14).

Figure 3:
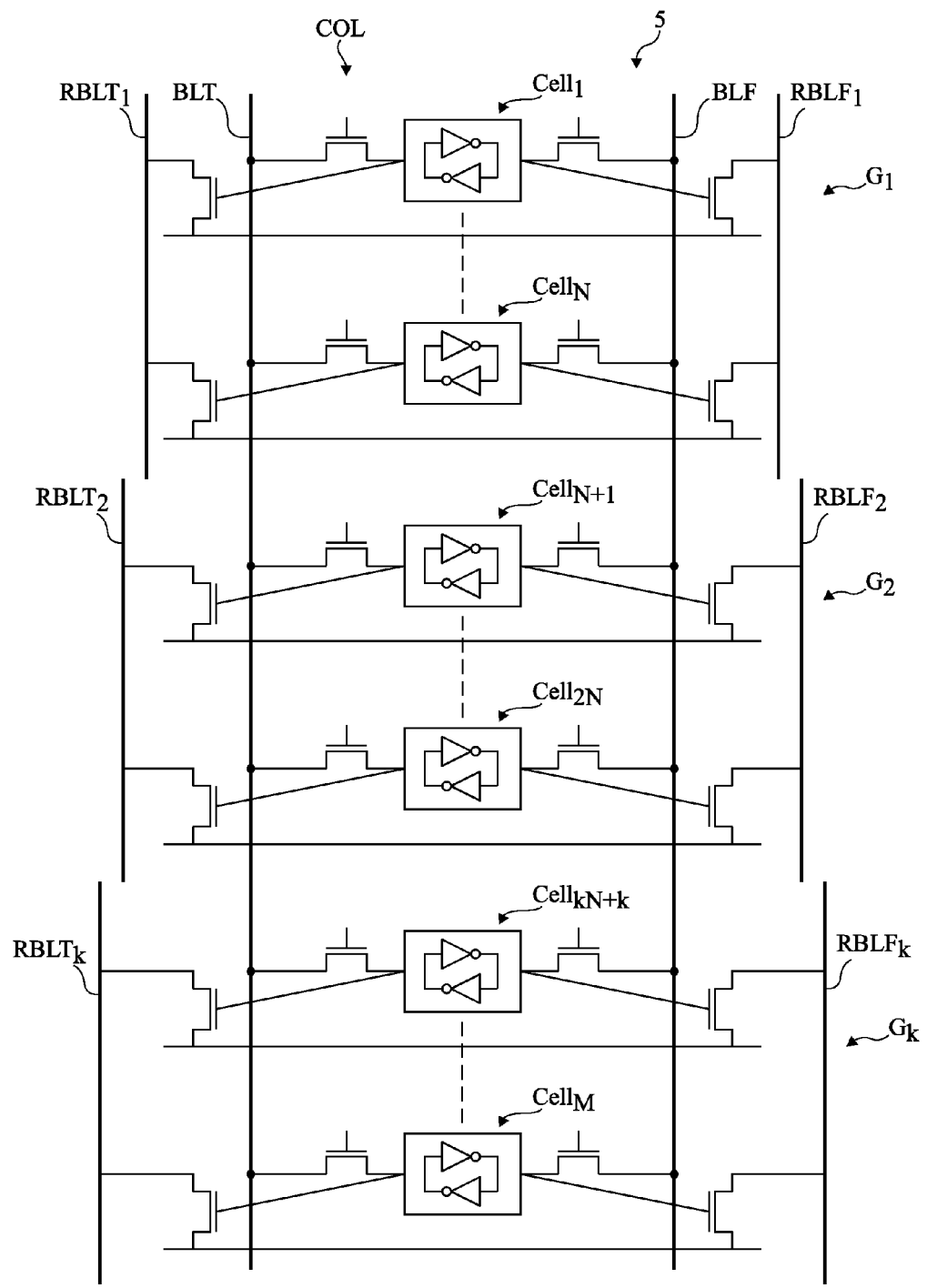
FIG. 3 schematically shows a volatile memory column according to an embodiment.

FIG. 3 shows an embodiment of a volatile memory 5. Memory 5 comprises memory cells distributed in rows and columns. Only one column COL is shown in FIG. 3. Column COL comprises memory cells $Cell_i$, with i varying from 1 to M where M is an integer strictly greater than 1. Each memory cell for example corresponds to the memory cell shown in FIG. 2.

The memory cells of column COL are gathered in groups of memory cell $G_1$ to $G_k$. As an example, each group of memory cells comprises the same number N of memory cells, N being an integer strictly greater than 1 and M being equal to k times N. As an example, FIG. 3 shows three groups of memory cells, a first group $G_1$ comprising memory cells $Cell_1$ to $Cell_N$, a second group $G_2$ comprising memory cells $Cell_{N+1}$ to $Cell_{2N}$, and the last group, $G_k$, comprising memory cells $Cell_{kN+k}$ to $Cell_M$.

The memory cells of a same group may be adjacent or distant memory cells. According to the present embodiment, two read bit lines $RBLT_j$ and $RBLF_j$ are assigned to each group $G_j$ of memory cells, with j varying from 1 to k. For example, read bit lines $RBLT_1$ and $RBLF_1$ are connected to the memory cells of group $G_1$. Read bit lines $RBLT_2$ and $RBLF_2$ are connected to the memory cells of group $G_2$ and read bit lines $RBLT_k$ and $RBLF_k$ are connected to the memory cells of group $G_k$.

Figure 4:
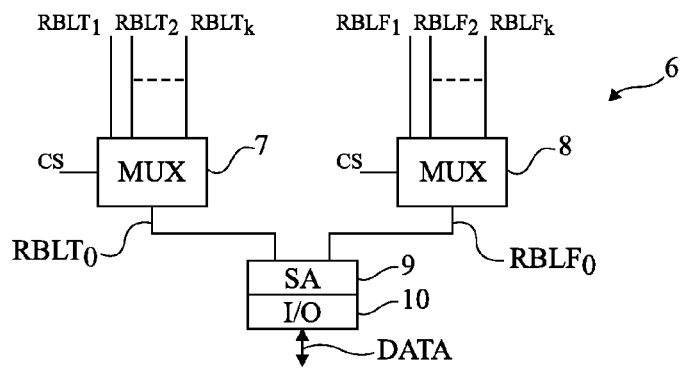
FIG. 4 schematically shows an embodiment of the logic circuits associated with the volatile memory column shown in FIG. 3.

FIG. 4 shows an embodiment of logic circuits 6 associated with column COL of memory 5 shown in FIG. 3. Logic circuits 6 comprise two multiplexers (MUX) 7, 8 for each column. Multiplexer 7 is connected to read bit lines $RBLT_1$ to $RBLT_k$ of column COL and to an output line $RBLT_0$. Multiplexer 8 is connected to read bit lines $RBLF_1$ to $RBLF_k$ of column COL and to an output line $RBLF_0$. Each multiplexer 7, 8 receives a control signal CS. Output lines $RBLT_0$ and $RBLF_0$ are coupled to an amplification unit 9 (SA) connected to an input-output interface 10 (I/O). Interface 10 may be connected to a data exchange bus DATA. Control signal CS can take k different values.

Multiplexer 7 is capable, according to control signal CS, of selecting the signal provided by one of bit read lines $RBLT_j$, with j varying from 1 to k, and of transmitting this signal over output line $RBLT_0$. Multiplexer 8 is capable, according to control signal CS, of selecting the signal provided by read bit line $RBLF_j$ and of transmitting this signal over output line $RBLF_0$. For the same value of control signal CS, multiplexers 7 and 8 provide the signals of read bit lines $RBLT_j$ and $RBLF_j$ having the same index j.

The operation of reading of the datum stored in a memory cell $Cell_i$, with i varying from 1 to M, of column COL is performed as previously described in relation with memory cell 2 shown in FIG. 2, with the difference that multiplexers 7 and 8 are, further, controlled to provide amplification unit 9 with the signals present on read bit lines $RBLT_j$ and $RBLF_j$, with j varying from 1 to k, coupled to memory cell $Cell_i$.

Read bit lines $RBLT_j$ and $RBLF_j$, with j varying from 1 to k, may correspond to metal tracks which extend over all the memory cells of column COL, all the way to logic circuits 6 associated with column COL. As a variation, read bit lines $RBLT_j$ and $RBLF_j$ extend only from logic circuits 6 on a portion of the column, to be connected to the associated memory cells. The memory cells of a low power supply voltage volatile memory comprise at least 8 MOS transistors. Thereby, read bit lines $RBLT_j$ and $RBLF_j$, with j varying from 1 to k, may be formed by metal tracks of one or of several metallization levels without requiring any increase of the surface area taken up by the memory when it is integrated.

As an example, column COL of the memory may comprise approximately 128 memory cells and approximately 2 pairs of read bit lines $RBLT_j$ and $RBLF_j$. Each read bit line $RBLT_j$ may be connected to approximately 64 memory cells per column.

Figure 5:
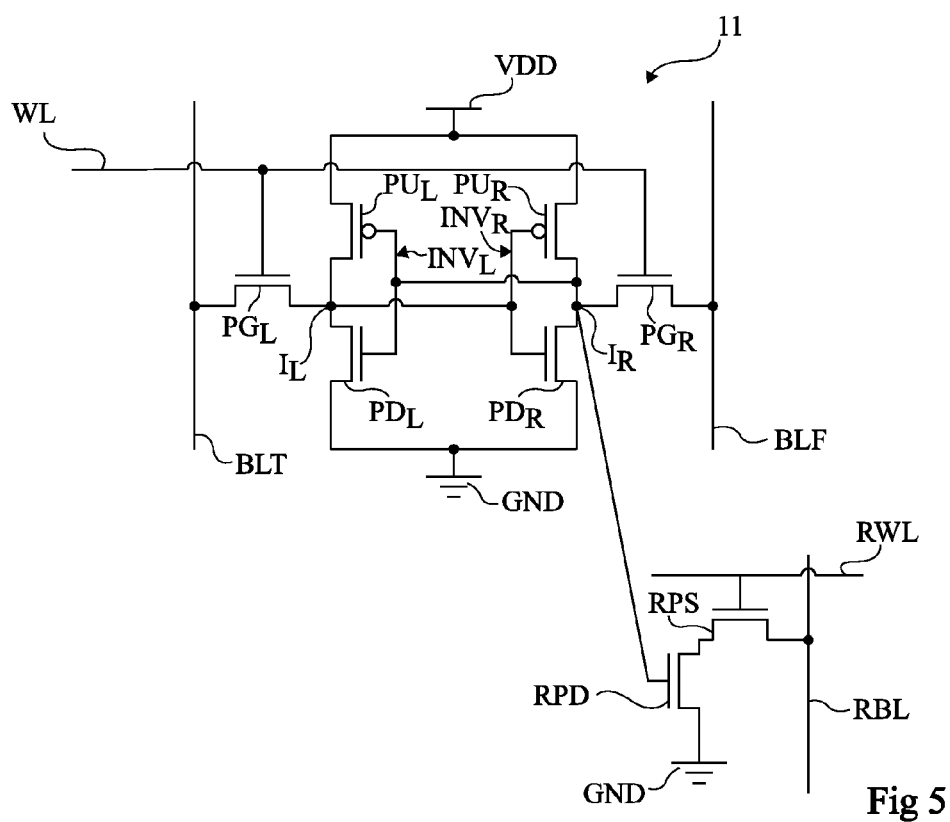
FIG. 5 schematically shows an example of a volatile memory cell.

FIG. 5 shows another embodiment of a memory cell 11 having a single bit line dedicated to read operations. The elements common with memory cell 2 shown in FIG. 2 are designated with the same reference numerals. Memory cell 11 comprises a transistor RPD, which is an N-type MOS transistor having its source coupled to ground GND, and having its gate coupled to node $I_R$ and a transistor RPS, which is an N-type MOS transistor having its source connected to the drain of transistor RPD, and having its drain connected to a read bit line RBL. The gate of transistor RPS is controlled by a row selection signal conveyed by a read word line RWL.

Figure 7:
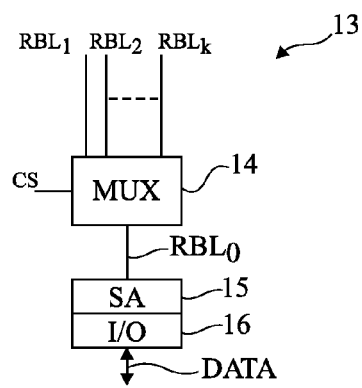
FIGS. 6 and 7 are views respectively equivalent to FIGS. 3 and 4 for the memory cell embodiment shown in FIG. 5.
Figure 6:
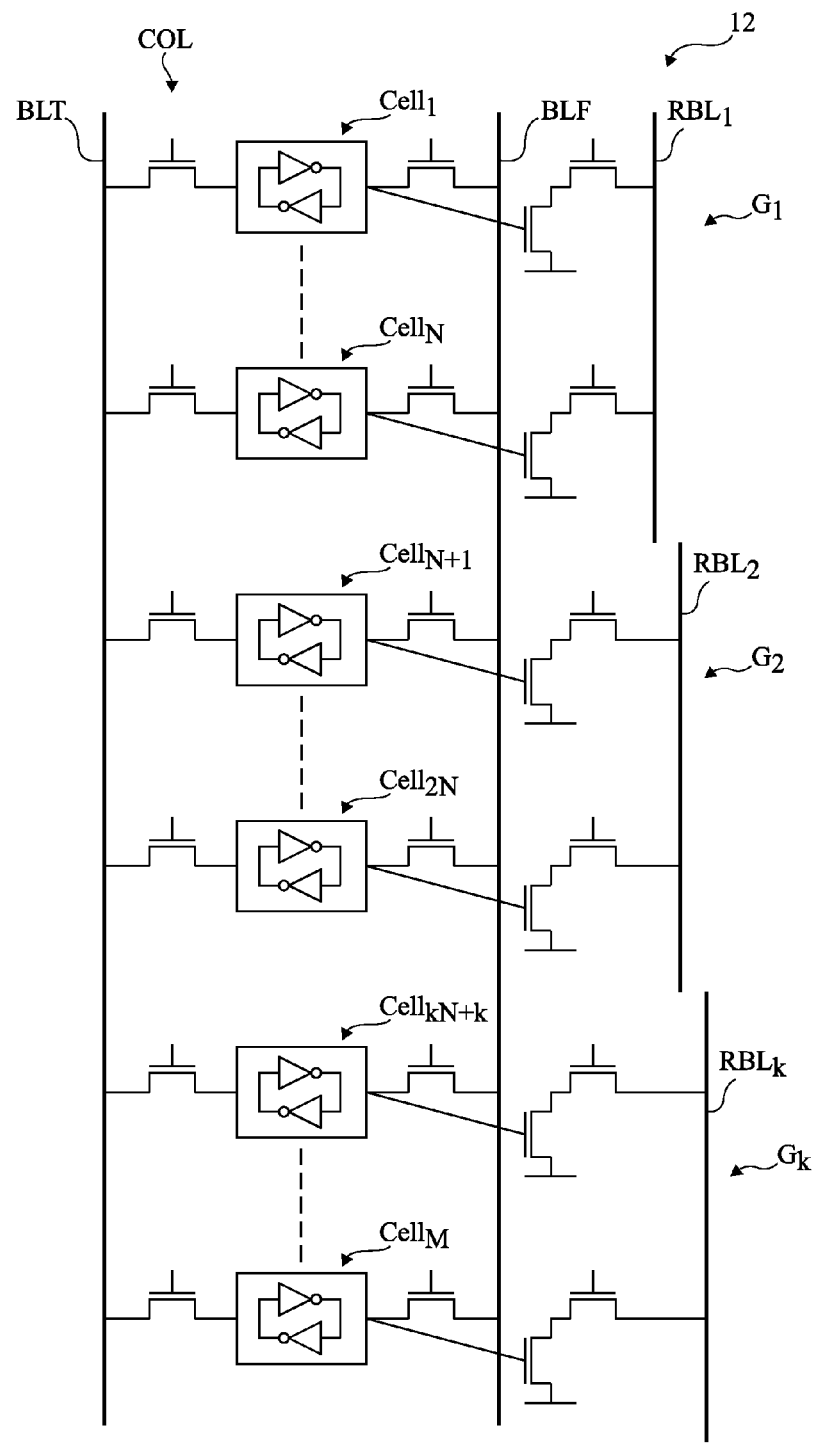

FIGS. 6 and 7 are views of a memory 12, respectively similar to FIGS. 3 and 4, for which each memory cell corresponds to memory cell 11 of FIG. 5. As previously described in relation with FIG. 3, the memory cells of a column COL are gathered in groups of memory cells $G_1$ to $G_k$. As an example, each group of memory cells comprises the same number N of memory cells, N being an integer strictly greater than 1 and M being equal to k times N.

According to the present embodiment, a read bit line $RBL_j$, with j varying from 1 to k, is assigned to each group $G_1$ to $G_k$ of memory cells. For example, read bit line $RBL_1$ is connected to the memory cells of group $G_1$. Read bit line $RBL_2$ is connected to the memory cells of group $G_2$ and read bit line $RBLT_k$ is connected to the memory cells of group $G_k$.

As shown in FIG. 7, logic circuits 13 associated with the column of memory 12 shown in FIG. 6 comprise a multiplexer (MUX) 14 for each column. Multiplexer 14 is connected to read bit lines $RBL_1$ to $RBL_k$ of the associated column and to an output line $RBL_0$. Multiplexer 14 receives a control signal CS. Output line $RBL_0$ is coupled to an amplification unit 15 (SA) connected to an input-output interface 16 (I/O). Interface 16 may be connected to a data exchange bus DATA. Control signal CS can take k different values.

Multiplexer 14 is capable, according to control signal CS, of selecting the signal provided by one of read bit lines $RBL_1$ to $RBL_k$ and of transmitting this signal over output line $RBLT_0$.

In an operation of reading of the datum stored in a memory cell of column COL, read word line RWL associated with the selected memory cell is set to the high state and the read word lines of all the other memory rows are set to the low state. Read bit line RBL is initially left floating in the high state. According to the datum stored in the memory cell, transistor RPD is on or off, which causes or not a modification of the voltage of read bit line RBL.

As compared with a hierarchic bit line configuration, the previously-described embodiments have the advantage that the selection of read bit lines $RBLT_i$, $RBLF_i$, and $RBL_i$ is performed by multiplexers 7, 8, 14, which are located at one end of the columns and not by switches distributed over the memory. The design of the memory is thus simplified.

Although the embodiments previously described in relation with FIGS. 3 to 7 are quite satisfactory to increase the number of memory cells per column of the volatile memory, embodiments will now be described, which enable to further decrease the volatile memory consumption.

Figure 8:
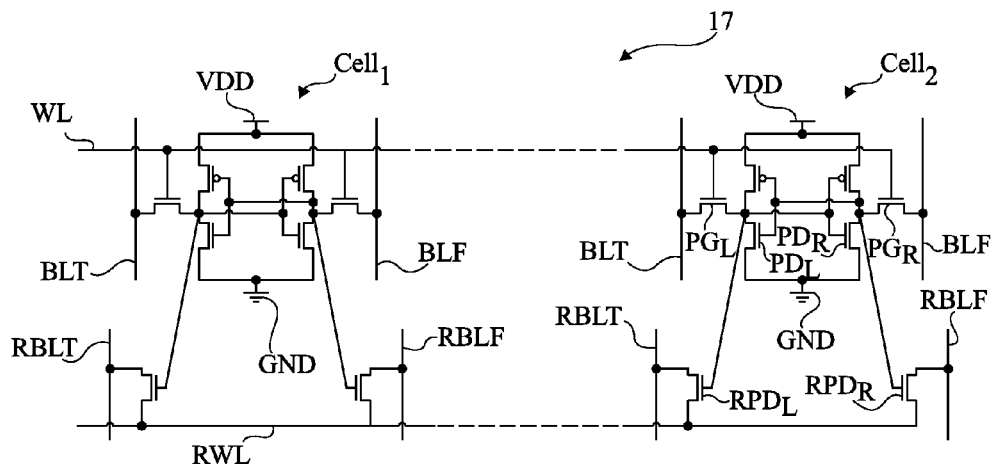
FIG. 8 schematically shows a row of a volatile memory comprising memory cells such as shown in FIG. 2.

FIG. 8 illustrates the appearing of leakage currents of volatile memory 17 comprising memory cells 2 such as shown in FIG. 2, two memory cells $Cell_1$ and $Cell_2$ being shown.

The consumption of memory 17 is increased with the appearing of parasitic currents during write operations. As an example, an operation of writing of a datum into memory cell $Cell_1$ while no datum is to be written into memory cell $Cell_2$ is considered. To achieve this, word line WL is set to the high state. One of write bit lines BLT or BLF of memory cell $Cell_1$ is set to the high state and the other bit line BLT or BLF is set to the low state according to the datum to be written into memory cell $Cell_1$. Write bit lines BLT and BLF associated with memory cell $Cell_2$ are both left floating in the high state. Since switches $PG_L$ and $PG_R$ of memory cell $Cell_2$ are on and one of transistors $PD_L$ or $PD_R$ is on, a parasitic current flows from one of bit lines BLT or BLF associated with memory cell $Cell_2$ to ground GND.

The consumption of memory 17 is further increased by the appearing of parasitic currents in read operations. As an example, an operation of reading of the datum stored in memory cell $Cell_1$ while no datum is to be read from memory $Cell_2$ is considered. In a read operation, word line RWL is set to the low state. Bit lines RBLT and RBLF associated with memory cell $Cell_1$ are left floating in the high state. According to the datum stored in memory cell $Cell_1$, the voltage of one of the two bit lines RBLT or RBLF decreases. Read bit lines RBLT and RBLF associated with memory cell $Cell_2$ may be left floating in the high state. Since one of transistors $RPD_L$ or $RPD_R$ of memory cell $Cell_2$ is on, a parasitic current thus flows between one of bit lines RBLT and RBLF associated with memory cell $Cell_2$ and read line RWL.

The memory cells according to the embodiments described hereinafter may be powered at a decreased power supply voltage VDD. As an example, voltage VDD may be on the order of 400 mV, especially when the memory cells are formed in a technology for which the channel length of MOS transistors is 32 nm. In particular, the memory cells according to the embodiments described hereinafter are capable of operating under the MOS transistor threshold voltage.

Figure 9:
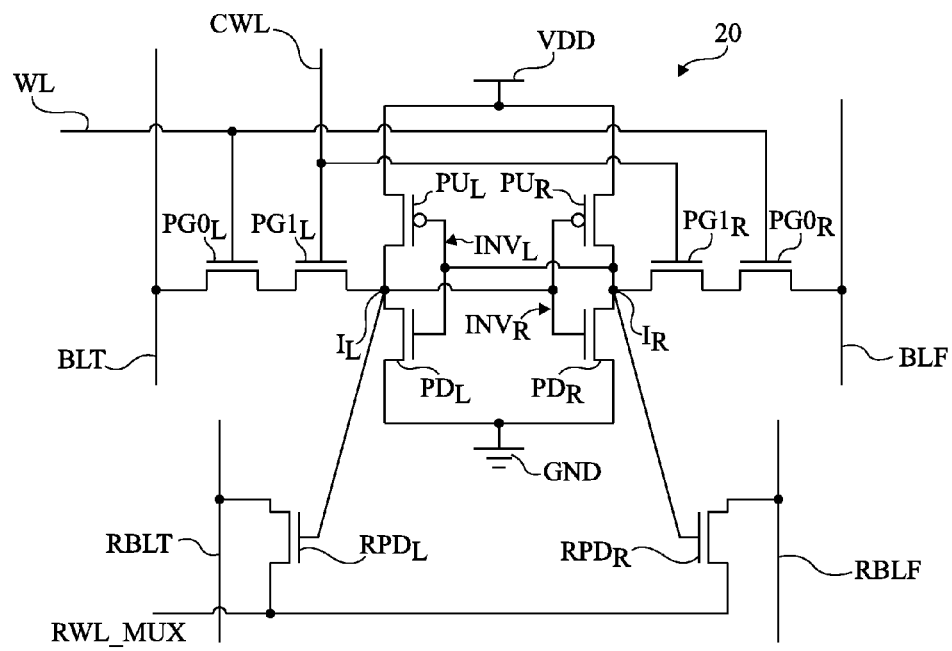
FIG. 9 shows another embodiment of a volatile memory cell.

FIG. 9 shows an embodiment of a volatile memory cell 20. As compared with memory cell 2 shown in FIG. 2, memory cell 20 comprises two additional MOS transistors. Transistor $PG_L$ of memory cell 2 is replaced with two N-type MOS transistors, $PG0_L$ and $PG1_L$. The gate of transistor $PG0_L$ is connected to word line WL. The gate of transistor $PG1_L$ is connected to a control line CWL. One of the conduction terminals of transistor $PG1_L$ is connected to bit line BLT and the other conduction terminal of transistor $PG0_L$ is connected to one of the conduction terminals of transistor $PG1_L$. The other conduction terminal of transistor $PG1_L$ is connected to node $I_L$. Similarly, transistor $PG_R$ is replaced with two N-type MOS transistors $PG0_R$ and $PG1_R$. The gate of transistor $PG0_R$ is connected to word line WL. The gate of transistor $PG1_R$ is connected to control line CWL. One of the conduction terminals of transistor $PG0_R$ is connected to bit line BLF and the other conduction terminal of transistor $PG0_R$ is connected to one of the conduction terminals of transistor $PG1_R$. The other conduction terminal of transistor $PG1_R$ is connected to node $I_R$. Word line WL is connected to each memory cell of the row containing memory cell 20. Control line CWL is connected to each memory cell of the column containing memory cell 20.

Further, word line RWL of memory cell 2 is replaced with a word line RWL_MUX, which is only connected to some of the memory cells of the row containing memory cell 20. Thereby, the memory comprises, for each row, several word lines RWL_MUX, each word line RWL_MUX being connected to a different portion of the memory cells of the row.

As an example, the memory may approximately comprise from 16 to 128 memory cells 20 per row and approximately from 2 to 4 read word lines RWL_MUX per row. Each read word line RWL_MUX may be connected to from 8 to 32 memory cells per row, approximately.

Memory cell 20 operates as follows.

In the absence of any read or write operation in the row containing memory cell 20, the states of the word, bit, and control lines are the following write word line WL is in the low state, control line CWL is in the low state, write bit line BLT is in the low state, write bit line BLF is in the low state, read bit line RBLT is in the high state, read bit line RBLF is in the high state, and the read word lines RWL_MUX associated with the row containing memory cell 20 are in the high state.

The leakage currents through off transistors $PG0_L$, $PG1_L$, $PG0_R$, $PG1_R$ are decreased since transistors $PG0_L$, $PG1_L$ are in series and, since transistors $PG0_R$, $PG1_R$ are in series, the resistance to the leakage current is greater than for memory cell 2.

In an operation of writing of a datum "0" (respectively of a datum "1") into memory cell 20, the states of the word, bit, and control lines are the following, write word line WL is in the high state, control line CWL is in the high state, write bit line BLT is in the low state (respectively in the high state), write bit line BLF is in the high state (respectively in the low state), read bit line RBLT is in the high state, read bit line RBLF is in the high state, and read word line RWL_MUX associated with the row containing the memory cell is in the high state.

The structure of memory cell 20 enables to perform an individual selection of memory cells from among the memory cells of a same row in write operations. For the unselected memory cells of the same row, write word line WL is in the high state and the associated control lines CWL are in the low state. Switches $PG1_L$ and $PG1_R$ of these cells are thus off. The leakage currents of the unselected memory cells 20 are lower than the parasitic currents appearing for the unselected memory cells 2 for which switches $PG_L$ and $PG_R$ remain off in a write operation. The memory consumption is thus decreased in a write operation.

In an operation of reading of the datum stored in memory cell 20, the states of the word, bit, and control lines are the following, write word line WL is in the low state, control line CWL is in the low state, write bit line BLT is in the low state, write bit line BLF is in the low state, read bit lines RBLT and RBLF are initially floating in the high state, and the read word line RWL_MUX associated with memory cell 20 is in the low state while the read word lines associated with the unselected memory cells of the row are in the high state.

The leakage currents through off transistors $PG0_L$, $PG1_L$, $PG0_R$, $PG1_R$ are decreased since transistors $PG0_L$, $PG1_L$ are in series and, since transistors $PG0_R$, $PG1_R$ are in series, the resistance to the leakage current is greater than for memory cell 2.

Since the read word lines RWL_MUX of the unselected memory cells are maintained in the high state and the associated read bit lines RBLT and RBLF are in the high state, there is no leakage current for these memory cells. The memory consumption in a read operation is thus decreased.

When power supply voltage VDD of the memory cells decreases, the memory becomes more sensitive to disturbances due to ionizing radiations. An ionizing ray generally tends to disturb adjacent memory cells.

The bits are generally stored in the memory in the form of groups of bits, called words. It may be advantageous to arrange the bits in the memory so that the bits stored in adjacent memory cells belong to separate words. Such a storage method is called bit interleaving.

Memory cell 20 eases the implementation of a bit interleaving in write and in read mode.

Figure 10:
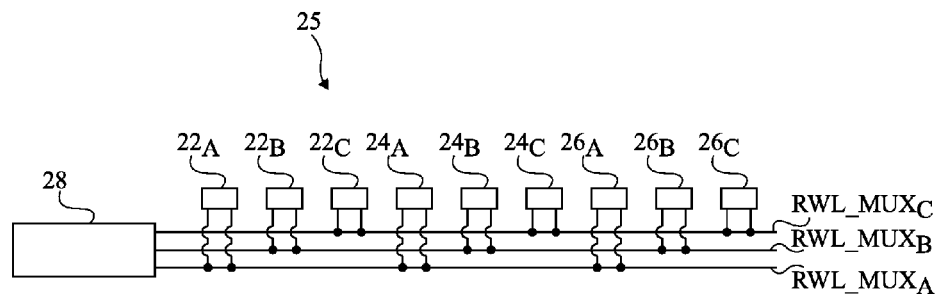
FIG. 10 schematically shows a row of a volatile memory comprising memory cells such as shown in FIG. 9.

FIG. 10 schematically shows memory cells $22_A$, $22_B$, $22_C$, $24_A$, $24_B$, $24_C$ and $26_A$, $26_B$, $26_C$ of a row of a volatile memory 25. Memory 25 further comprises three read word lines $RWL\_MUX_A$, $RWL\_MUX_B$, and $RWL\_MUX_C$ associated with the row. Read word lines $RWL\_MUX_A$, $RWL\_MUX_B$, and $RWL\_MUX_C$ are connected to a multiplexing unit 28. As an example, read word line $RWL\_MUX_A$ is only connected to memory cells $22_A$, $24_A$, and $26_A$. Read word line $RWL\_MUX_B$ is only connected to memory cells $22_B$, $24_B$, and $26_B$ and read word line $RWL\_MUX_C$ is only connected to memory cells $22_C$, $24_C$, and $26_C$. The number of read word lines depends on the number of groups of memory cells to be selected separately from the other memory cells in the row.

In write mode, the bit interleaving method may be implemented by only selecting the memory cells 20 desired by write word line WL and control line CWL. In read mode, the interleaving method may be implemented by read word lines $RWL\_MUX_A$, $RWL\_MUX_B$, $RWL\_MUX_C$. As an example, when a read operation must be carried out in memory cells $22_A$, $24_A$, and $26_A$, read line $RWL\_MUX_A$ is set to the low state while the other read lines $RWL\_MUX_B$ and $RWL\_MUX_C$ are maintained in the high state.

Figure 11:
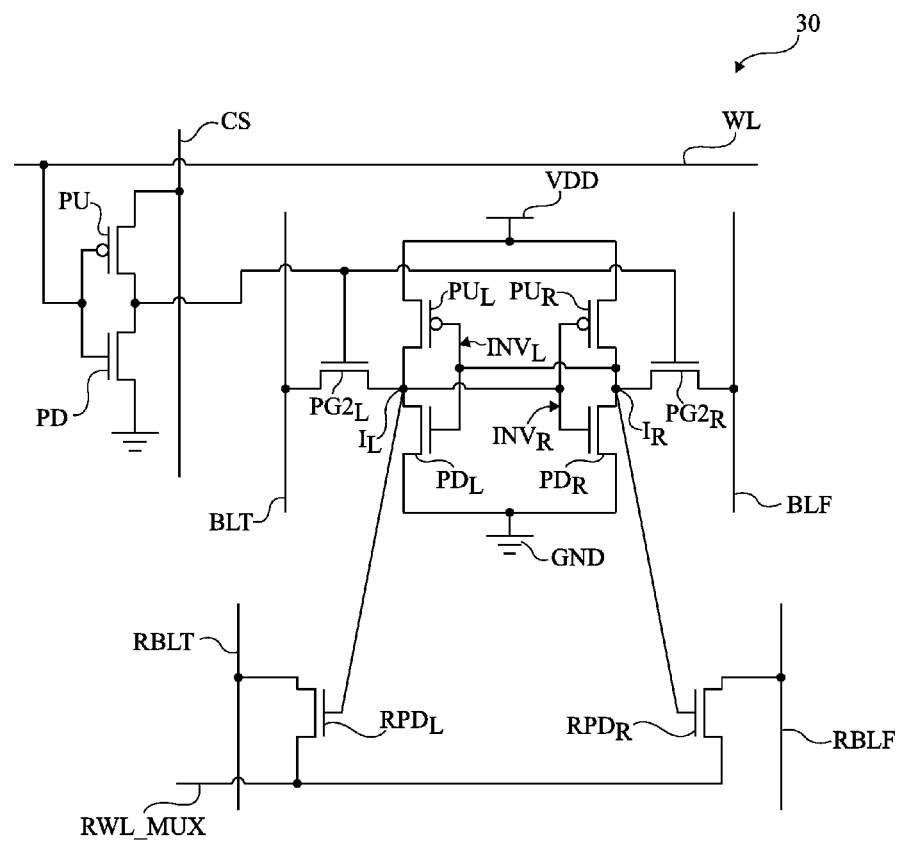
FIGS. 11 and 12 show other embodiments of volatile memory cells.

FIG. 11 shows another embodiment of a memory cell 30. As compared with memory cell 2 shown in FIG. 2, memory cell 30 comprises two additional inverter-assembled MOS transistors. Further, transistor $PG_L$ is replaced with an N-type MOS transistor, $PG2_L$, and transistor $PG_R$ is replaced with an N-type MOS transistor, $PG2_R$. More specifically, memory cell 30 comprises a P-type MOS transistor, PU, having its gate connected to word line WL, having its source connected to a control line CS, and having its drain connected to the gates of transistors $PG2_L$ and $PG2_R$. Memory cell 30 further comprises an N-type MOS transistor, PD, having its gate connected to word line WL, having its source connected to ground GND, and having its drain connected to the gates of transistors $PG2_L$ and $PG2_R$. Control line CS is connected to each memory cell of the column containing memory cell 30.

Further, word line RWL of memory cell 2 is replaced with a word line RWL_MUX which is only connected to some of the memory cells of the row, as previously described in relation with memory cell 20.

Memory cell 30 operates as follows.

In the absence of any read or write operation in the row containing memory cell 30, the states of the word, bit, and control lines are the following write word line WL is in the high state, control line CS is in the low state, write bit line BLT is in the low state, write bit line BLF is in the low state, read bit line RBLT is in the high state, read bit line RBLF is in the high state, and the read word lines RWL_MUX associated with the row containing memory cell 30 are in the high state.

As a variation, control line CS may be taken to a negative voltage, for example, on the order of −0.3 V. This enables to decrease leakage currents through switches $PG2_L$ and $PG2_R$.

In an operation of writing of a datum "0" (respectively of a datum "1") into memory cell 30, the states of the word, bit, and control lines are the following write word line WL is in the low state, control line CS is in the high state, write bit line BLT is in the low state (respectively in the high state), write bit line BLF is in the high state (respectively in the low state), read bit line RBLT is in the high state, read bit line RBLF is in the high state, and the read word lines RWL_MUX associated with the row containing memory cell 30 are in the high state.

The structure of memory cell 30 enables to perform an individual selection of memory cells from among the memory cells of a same row in write operations. For the unselected memory cells of the same row, write word line WL is in the low state and the associated control lines CS are in the high state. Switches $PG2_L$ and $PG2_R$ of these cells are thus off. The leakage currents of the unselected memory cells 30 are lower than the parasitic currents appearing for the unselected memory cells 2 for which switches $PG_L$ and $PG_R$ remain off in a write operation. The memory consumption is thus decreased in a write operation.

In an operation of reading of the datum stored in memory cell 30, the states of the word, bit, and control lines are the following, write word line WL is in the high state, control line CWL is in the low state, write bit line BLT is in the low state, write bit line BLF is in the low state, read bit lines RBLT and RBLF are initially floating in the high state, and the read word line RWL_MUX associated with memory cell 30 is in the low state while the read word lines associated with the unselected memory cells of the row are in the high state.

As a variation, control line CS may be taken to a negative voltage, for example, on the order of −0.3 V. This enables to decrease leakage currents through switches $PG2_L$ and $PG2_R$.

Since the read word lines RWL_MUX of the unselected memory cells are maintained in the high state and the associated read bit lines RBLT and RBLF are in the high state, there is no leakage current for these memory cells. The memory consumption in a read operation is thus decreased.

Memory cell 30 eases the implementation of a bit interleaving method in read and write mode, as previously described in relation with memory cell 20.

Figure 12:
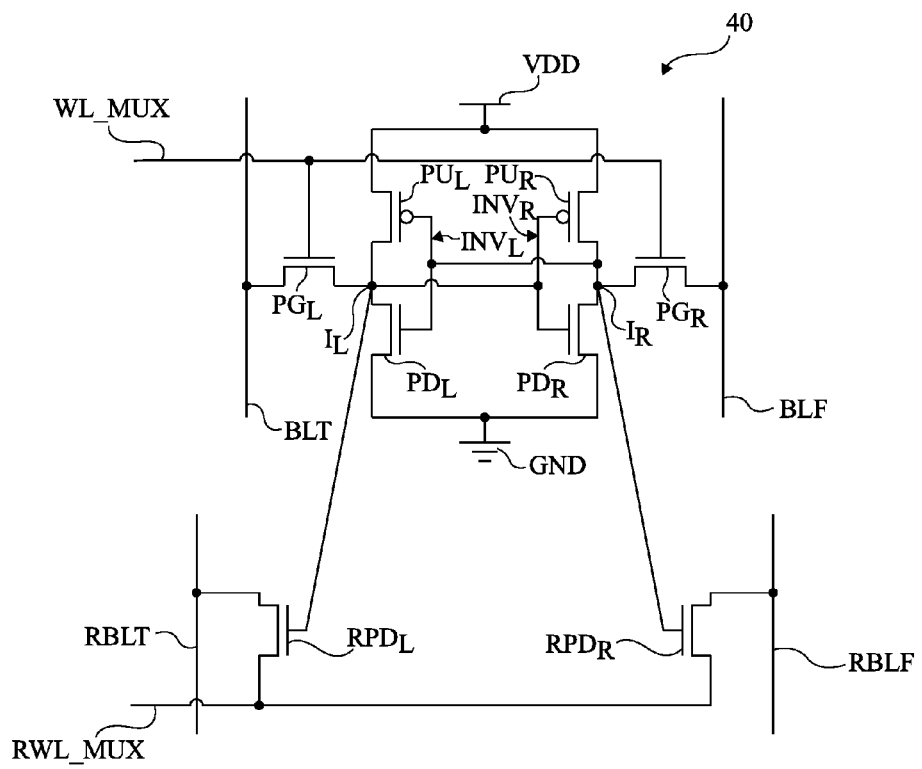

FIG. 12 shows another embodiment of a volatile memory cell 40. As compared with memory cell 2 shown in FIG. 2, read word line RWL of memory cell 2 is replaced with a word line RWL_MUX, which is only connected to some memory cells of the row containing memory cell 40, as previously described in relation with memory cell 20. Thereby, the memory comprises, for each row, several word lines RWL_MUX, each word line RWL_MUX being connected to a different group of memory cells of the row.

Further, write word line WL of memory cell 2 is replaced with a write word line WL_MUX, which is only connected to some of the memory cells of the row containing memory cell 40. Thereby, the memory comprises, for each row, several write word lines WL_MUX, each write word line WL_MUX being connected to a different group of memory cells of the row. The memory cells of a same group are connected to the same write word line WL_MUX and to the same read word line RWL_MUX.

Memory cell 40 operates as follows.

In the absence of any read or write operation in the row containing memory cell 40, the states of the word, bit, and control lines are the following, the write word lines WL_MUX associated with the row containing memory cell 40 are in the low state, write bit line BLT is in the low state, write bit line BLF is in the low state, read bit line RBLT is in the high state read bit line RBLF is in the high state, and the read word lines RWL_MUX associated with the row containing memory cell 40 are in the high state.

In an operation of writing of a datum "0" (respectively of a datum "1") into memory cell 40, the states of the word, bit, and control lines are the following, the write word line WL_MUX associated with the row containing the memory cell is in the high state while the write word lines associated with the unselected memory cells of the row are in the low state, write bit line BLT is in the low state (respectively in the high state), write bit line BLF is in the high state (respectively in the low state), read bit line RBLT is in the high state, read bit line RBLF is in the high state, and the read word lines RWL_MUX associated with the row containing the memory cell are in the high state.

The structure of memory cell 40 enables to select groups of memory cells from among the memory cells of a same row in write operations. For the unselected memory cells of the same row, write word line WL_MUX is in the low state. Switches $PG_L$ and $PG_R$ of these cells are thus off. The leakage currents of the unselected memory cells 40 are lower than the parasitic currents appearing for the unselected memory cells 2 for which switches $PG_L$ and $PG_R$ remain off in a write operation. The memory consumption is thus decreased in a write operation.

In an operation of reading of the datum stored in memory cell 40, the states of the word, bit, and control lines are the following, write word lines WL_MUX associated with the row containing memory cell 40 are in the low state, write bit line BLT is in the low state, write bit line BLF is in the low state, read bit lines RBLT and RBLF are initially floating in the high state, and the read word line RWL_MUX associated with memory cell 40 is in the low state while the read word lines associated with the unselected memory cells of the row are in the high state.

Since the read word lines RWL_MUX of the unselected memory cells are maintained in the high state and the associated read bit lines RBLT and RBLF are in the high state, there is no leakage current for these memory cells. The memory consumption in a read operation is thus decreased.

Memory cell 40 eases the implementation of a bit interleaving in write and in read mode.

Figure 13:
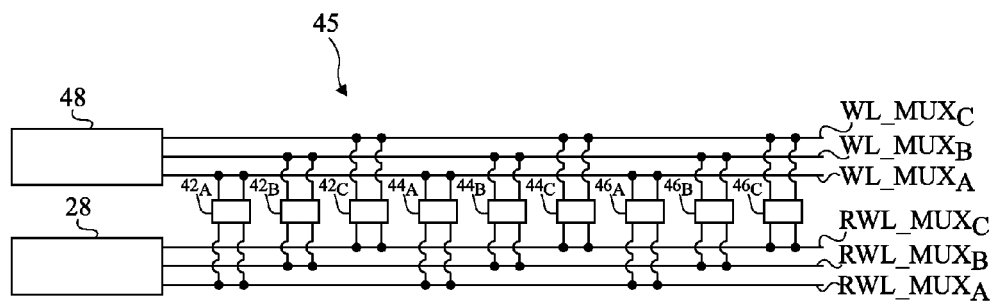
FIG. 13 schematically shows a row of a volatile memory comprising memory cells such as shown in FIG. 12.

FIG. 13 schematically shows memory cells $42_A$, $42_B$, $42_C$, $44_A$, $44_B$, $44_C$, and $46_A$, $46_B$, $46_C$ of a row of a volatile memory 45. Memory 45 further comprises three read word lines $RWL\_MUX_A$, $RWL\_MUX_B$, and $RWL\_MUX_C$ associated with the row and three write word lines $WL\_MUX_A$, $WL\_MUX_B$, and $WL\_MUX_C$ associated with the row. Read word lines $RWL\_MUX_A$, $RWL\_MUX_B$, and $RWL\_MUX_C$ are connected to a multiplexing unit 28. Write word lines $WL\_MUX_A$, $WL\_MUX_B$, and $WL\_MUX_C$ are connected to a multiplexing unit 48. As an example, read word line $RWL\_MUX_A$ and write word line $WL\_MUX_A$ are only connected to memory cells $42_A$, $44_A$, and $46_A$. Read word line $RWL\_MUX_B$ and write word line $WL\_MUX_B$ are only connected to memory cells $42_B$, $44_B$, and $46_B$, and read word line $RWL\_MUX_C$ and write word line $WL\_MUX_C$ are only connected to memory cells $42_C$, $44_C$, and $46_C$. The number of read word lines and of write word lines depends on the number of groups of memory cells to be selected separately from the other memory cells in the row.

In write mode, the bit interleaving method may be implemented by write word lines $WL\_MUX_A$, $WL\_MUX_B$, $WL\_MUX_C$. As an example, when a write operation must be carried out in memory cells $42_A$, $44_A$, and $46_A$, write line $WL\_MUX_A$ is set to the high state while the other write lines $WL\_MUX_B$ and $WL\_MUX_C$ are maintained in the low state. In read mode, the interleaving method may be implemented by read word lines $RWL\_MUX_A$, $RWL\_MUX_B$, $RWL\_MUX_C$. As an example, when a read operation must be carried out in memory cells $42_A$, $44_A$, and $46_A$, read line $RWL\_MUX_A$ is set to the low state while the other read lines $RWL\_MUX_B$ and $RWL\_MUX_C$ are maintained in the high state.

Specific embodiments of the present invention have been described. Various alterations and modifications will occur to those skilled in the art. In particular, the N or P type of at least some of the MOS transistors described in the previous embodiments may be inverted. It should further be noted that those skilled in the art may combine various elements of these various embodiments and variations without showing any inventive step. In particular, a memory may comprise memory cells having different structures according to one of the embodiments previously described in relation with FIGS. 9, 11, and 12. Further, in a retention operation, power supply voltage VDD of the memory cells may be decreased with respect to a read or write operation. As an example, in a retention operation, voltage VDD may be on the order of 300 mV, especially when the memory cells are formed in a technology for which the channel length of MOS transistors is 32 nm.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A volatile memory comprising:
a plurality of volatile memory cells arranged in rows and in columns and being distributed in first separate groups of memory cells for each column;
a plurality of write bit lines, each write bit line dedicated to write operations and coupled to all the memory cells in an associated column;
a plurality of read bit lines dedicated to read operations, each read bit line being coupled to all the memory cells of only one of the first groups of memory cells, each memory cell in a particular column being coupled to a single one of the read bit lines;
for each column, a multiplexer coupled to all the read bit lines and configured to receive a control signal; and
for each column, an amplifier, the multiplexer configured to deliver the signal present on one of the read bit lines to the amplifier according to the control signal.

2. The memory of claim 1, wherein the memory cells are distributed in second separate groups of memory cells for each row, the memory comprising a first memory cell selection circuit dedicated to write operations and a second memory cell selection circuit, different from the first circuit, dedicated to read operations, wherein the first circuit is capable of selecting, for each row, memory cells from one of the first groups of memory cells for a write operation and the second circuit is capable of selecting, for each row, memory cells from one of the first groups of memory cells for a read operation.

3. The volatile memory of claim 2, wherein the second selection circuit comprises read word lines for each row, each read word line being coupled to all the memory cells of one of the second groups of memory cells, for each row, each memory cell in the row being coupled to a single one of the read word lines.

4. The volatile memory of claim 3, wherein each memory cell comprises:
first and second inverters, an output of the first inverter being coupled to an input of the second inverter and an output of the second inverter being coupled to an input of the first inverter;
a first switch coupled to the output of the first inverter;
a second switch coupled to the output of the second inverter;
a first MOS transistor having two first conduction terminals and a first gate, the first gate being coupled to the output of the first inverter; and
a second MOS transistor having two second conduction terminals and a second gate, the second gate being coupled to the output of the second inverter;
wherein each read word line is coupled to one of the first conduction terminals and to one of the second conduction terminals; and
wherein the first selection circuit comprises a circuit capable of turning on the first and second switches of one of the groups of memory cells.

5. The volatile memory of claim 4, further comprising, for each column and for each first group of the column, first and second read bit lines, wherein the other one of the first conduction terminals of the first MOS transistor is coupled to the first read bit line and the other one of the second conduction terminals of the second MOS transistor is coupled to the second read bit line.

6. The volatile memory of claim 4, wherein the first switch comprises a third MOS transistor coupled between the output of the first inverter to a first write bit line and wherein the second switch comprises a fourth MOS transistor coupled between the output of the second inverter to a second write bit line.

7. The volatile memory of claim 6, wherein the first selection circuit comprises write word lines for each row, each write word line being coupled to the gates of the third and fourth MOS transistors of the memory cells of one of the groups of memory cells.

8. The volatile memory of claim 6, wherein the first selection circuit comprises a third inverter, the output of the third inverter being coupled to the gates of the third and fourth transistors and the input of the third inverter being coupled to a write word line.

9. The volatile memory of claim 6, wherein the first selection circuit comprises a fifth MOS transistor interposed between the third MOS transistor and the first write bit line (BLT) and a sixth MOS transistor interposed between the fourth MOS transistor and the second write bit line.

10. An electronic device comprising:
a battery; and
a memory array that is powered by the battery, the memory array comprising:
a plurality of volatile memory cells to which data write and read operations are performed, the memory cells being arranged in rows and in columns and being distributed in first separate groups of memory cells for each column;
a plurality of write bit lines, each write bit line dedicated to write operations and coupled to all the memory cells in an associated column;
a plurality of read bit lines dedicated to read operations, each read bit line being coupled to all the memory cells of only one of the first groups of memory cells, each memory cell in a particular column being coupled to a single one of the read bit lines;

for each column, a multiplexer coupled to all the read bit lines and configured to receive a control signal; and for each column, an amplifier, the multiplexer configured to deliver the signal present on one of the read bit lines to the amplifier according to the control signal.

11. The memory of claim 10, wherein the memory cells are distributed in second separate groups of memory cells for each row, the memory comprising a first memory cell selection circuit dedicated to write operations and a second memory cell selection circuit, different from the first circuit, dedicated to read operations, wherein the first circuit is capable of selecting, for each row, memory cells from one of the first groups of memory cells for a write operation and the second circuit is capable of selecting, for each row, memory cells from one of the first groups of memory cells for a read operation.

12. The volatile memory of claim 11, wherein the second selection circuit comprises read word lines for each row, each read word line being coupled to all the memory cells of one of the second groups of memory cells, for each row, each memory cell in the row being coupled to a single one of the read word lines.

13. The volatile memory of claim 12, wherein each memory cell comprises:

first and second inverters, an output of the first inverter being coupled to an input of the second inverter and an output of the second inverter being coupled to an input of the first inverter;

a first switch coupled to the output of the first inverter;

a second switch coupled to the output of the second inverter;

a first MOS transistor having two first conduction terminals and a first gate, the first gate being coupled to the output of the first inverter; and a second MOS transistor having two second conduction terminals and a second gate, the second gate being coupled to the output of the second inverter;

wherein each read word line is coupled to one of the first conduction terminals and to one of the second conduction terminals; and wherein the first selection circuit comprises a circuit capable of turning on the first and second switches of one of the groups of memory cells.

14. The volatile memory of claim 13, further comprising, for each column and for each first group of the column, first and second read bit lines, wherein the other one of the first conduction terminals of the first MOS transistor is coupled to the first read bit line and the other one of the second conduction terminals of the second MOS transistor is coupled to the second read bit line.

15. The volatile memory of claim 13, wherein the first switch comprises a third MOS transistor coupled between the output of the first inverter to a first write bit line and wherein the second switch comprises a fourth MOS transistor coupled between the output of the second inverter to a second write bit line.

16. The volatile memory of claim 15, wherein the first selection circuit comprises write word lines for each row, each write word line being coupled to the gates of the third and fourth MOS transistors of the memory cells of one of the groups of memory cells.

17. The volatile memory of claim 15, wherein the first selection circuit comprises a third inverter, the output of the third inverter being coupled to the gates of the third and fourth transistors and the input of the third inverter being coupled to a write word line.

18. The volatile memory of claim 15, wherein the first selection circuit comprises a fifth MOS transistor interposed between the third MOS transistor and the first write bit line (BLT) and a sixth MOS transistor interposed between the fourth MOS transistor and the second write bit line.

19. A memory comprising:

a plurality of volatile memory cells to which data write and read operations are performed, the memory cells being arranged in rows and in columns and being distributed in first separate groups of memory cells for each column;

a plurality of write bit lines, each write bit line dedicated to write operations and coupled to all the memory cells in an associated column;

a plurality of read bit lines dedicated to read operations, each read bit line being coupled to all the memory cells of only one of the first groups of memory cells, each memory cell in a particular column being coupled to a single one of the read bit lines;

means for selecting between the read bit lines of a column; and means for amplifying a signal present on the selected read bit line.

20. The memory of claim 19, wherein each memory cell comprises a six-transistor SRAM cell.

* * * * *